United States Patent [19]

Koiwai et al.

[11] Patent Number: 4,640,001
[45] Date of Patent: Feb. 3, 1987

[54] SOLAR CELL MANUFACTURING METHOD

[75] Inventors: Sakae Koiwai, Ohmihachiman; Keizo Asaoka; Katsuhiko Shirasawa, both of Yohkaichi; Hiroyuki Watanabe, Kusatsu; Junichi Honda, Sakura, all of Japan

[73] Assignee: Japan Solar Energy Co., Ltd., Japan

[21] Appl. No.: 684,271

[22] Filed: Dec. 20, 1984

[51] Int. Cl.$^4$ ............................................. H01L 31/18
[52] U.S. Cl. ...................................... 29/572; 136/256; 136/258; 427/74; 427/94
[58] Field of Search ........................... 29/572, 590, 591; 136/256, 258 PC; 427/74, 94

[56] References Cited

U.S. PATENT DOCUMENTS 4,253,881  3/1981  Hezel ..................................... 136/256
4,359,487  11/1982 Schneider ............................. 427/75
4,451,969  6/1984  Chaudhuri ............................ 29/572

FOREIGN PATENT DOCUMENTS 58-151070  9/1983  Japan ..................................... 136/256
58-220477  12/1983 Japan ..................................... 136/256

OTHER PUBLICATIONS

T. G. Sparks et al, *Conf. Record, 14th IEEE Photovoltaic Specialists Conf.* (1980), pp. 783-786.
F. W. Sexton, *Solar Energy Materials*, vol. 7, pp. 1-14 (1982).

*Primary Examiner*—Aaron Weisstuch
*Attorney, Agent, or Firm*—Spensley Horn Jubas & Lubitz

[57] ABSTRACT

Solar cell manufacturing method in which a silicon wafer is coated with an antireflection coating of silicon nitride by means of plasma CVD deposition with the silicon wafer kept at a temperature between 250° C. and 600° C. The coating of silicon nitride at such a high temperature results in a decrease in the recombination speed of the minority carriers produced in the silicon wafer during time of light incidence. The conversion efficiency is thus increased to a value ranging from 11.04% to 12.56%.

1 Claim, 10 Drawing Figures

SOLAR CELL MANUFACTURING METHOD

BACKGROUND OF THE INVENTION

1. Field of the Invention

The present invention relates to a solar cell manufacturing method.

2. Prior Art

A solar cell is generally provided with electrodes for outputting the generated electromotive force and with an antireflection coating for reducing energy loss due to the reflection of light incident to the cell. In conventional methods of manufacturing solar cells, the antireflection coating is applied after the formation of the electrodes (except in those cases where exceptional kinds of materials are used). The reason is that, generally, the coating materials are electrically highly-resistive, and therefore the formation of electrodes after the application of the coating causes the resistance of the electrodes to be extremely high, making the product impractical. It is known that, when the antireflection coating is made of titanium oxide, the process of baking electrodes provided on the coating will break the coating at those parts to contact with the electrodes, causing the latter to contact the wafer. However, such a method can not be used for most coating materials other than titanium oxide.

The electrodes, which are formed usually by means of printing, plating, or evaporation, conventionally are coated with solder to improve the weather resistance and reliability of the solar cell and to enable lead wires to be easily connected. Therefore, the process of applying the antireflection coating must be carried out at a temperature below 180° C., the melting point of solder. The plasma CVD (chemical vapor deposition) method, one of the conventional methods of coating, has also been employed at a temperature not exceeding the melting point of solder. However, this process temperature requirement results in a disadvantage, especially when using silicon nitride as a coating material. Silicon nitride is deposited in the form of a film on a solar cell element by means of the plasma CVD method. The application of a silicon nitride film makes the surface of the cell element inactive, resulting in a decrease in the recombination rate of minority carriers produced by the irradiation of light, and the electrical characteristics of the solar cell are thus improved. Besides, this phenomenon has been found more remarkable when silicon nitride is deposited at higher temperatures. Therefore, the above low process temperature requirements accompanying the conventional technology present an important disadvantage in the application of an antireflection coating.

OBJECTS AND SUMMARY OF THE INVENTION

An object of the present invention is to provide a method of manufacturing a solar cell whose energy conversion efficiency is much higher than that of conventional solar cells.

Another object of the present invention is to provide a method of manufacturing a solar cell by depositing a silicon nitride film as an antireflection coating on a silicon wafer by means of the plasma CVD method with the process temperature kept at a conventionally prohibited high temperature.

According to the present invention, prior to forming electrodes, silicon nitride is deposited as an antireflection coating on a silicon wafer having a p-n junction, with the wafer kept at a temperature between 250° C. and 600° C., and then the coating is partially removed by an etching method at the regions where the electrodes are to be formed.

BRIEF DESCRIPTION OF THE DRAWINGS

The details of the invention will be described in the following with reference to the attached drawings, in which.

DETAILED DESCRIPTION OF THE INVENTION

A solar cell manufacturing method according to the present invention is as follows.

Figure 1:
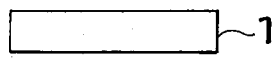
FIGS. 1 to 9 illustrate a solar cell manufacturing method in accordance with the present invention.

In the first place, a polycrystalline p-type Si wafer 1 (see FIG. 1) is subjected, for 5 minutes, to etching by an acid mixture of hydrofluoric and nitric acid mixed at a ratio of 1:9 to remove 20μ of the wafer surface (which includes surface damages), and washed with water (FIG. 1).

Figure 2:
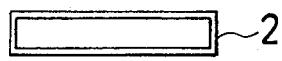

Then, an n+ layer 2 is formed on the wafer surface in a diffusion furnace by means of vapor diffusion of phosphorus (P) with phosphorus oxychloride $POCl_3$ used as source material (FIG. 2).

Figure 3:
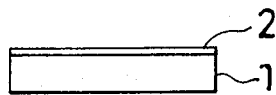

The n+ layer is removed only from the lower surface of the wafer by an etching method using the above acid mixture, with an etching resist applied to the upper surface, (i.e., the light-receiving side of the wafer). After the etching resist is removed with an organic solvent, the whole element is washed with water (FIG. 3).

Figure 4:

After the foregoing steps, silicon nitride ($Si_3N_4$) is deposited to form an antireflection coating 3 by means of the plasma CVD method at a wafer-temperature between 250° C. and 600° C. (FIG. 4). The gases to be used in the silicon nitride deposition process and their quantities are silane at 170 cc/min and ammonia at 1000 cc/min.

Figure 5:
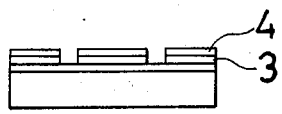

The thus deposited silicon nitride coating is then partially removed at the regions where electrodes are to be formed. The partial removal of the coating is carried out by an etching method using a mixture of hydrofluoric acid and pure water mixed at a ratio of 1:3, with an etching resist 4 applied to the coating excluding the parts where the electrodes are to be formed (FIG. 5).

Figure 6:
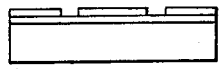

The remaining etching resist 4 is then removed with an organic solvent (FIG. 6).

Figure 7:
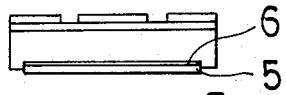

After the above process, a metallic paste 5 containing aluminum powder as the main constituent is applied to the lower side of the wafer, and then baked to constitute a p+ layer 6 (FIG. 7).

Figure 8:
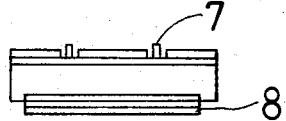

In the next step electrodes 7 and 8 are formed with Ag paste applied to the upper and the lower side of the wafer by a printing method. In the application of the paste the upper side is suitably masked so that the paste may be applied only to the exposed parts of the n+ layer. The applied Ag paste is then baked to effect hardening (FIG. 8).

Figure 9:
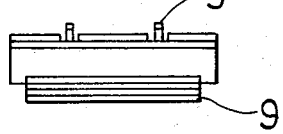

Finally, the electrodes 7, 8 are covered with solder 9 to protect the same and to connect lead wires thereto (FIG. 9).

In the above process, the antireflection coating 3 is patterned (FIG. 3) by a method using an etching resist, but the method can be replaced with a method using a photo-resist. The above-described application of Ag paste to form the electrodes is by a printing method, but such method can be replaced with other known methods such as plating or evaporation.

The characteristics of several solar cells manufactured in accordance with the method described above as illustrated in FIGS. 1 to 8 are set forth below to show the excellent results obtained by the present invention.

Eight sample solar cells Nos. 1 to 8 are listed in Table 1, which presents data regarding their respective antireflection coatings, deposition temperatures, deposition times, refractive indices and thicknesses. Of these eight samples, sample No. 1 is for comparison and has its coating deposited at a temperature of 150° C., which is outside the deposition temperature range (from 250° C. to 600° C.) specified in the present invention, though the manufacturing procedures, except for the coating deposition temperature, are the same as those for all the other samples.

TABLE 1

| Coating | Sample No. | | | | | | | |
|---|---|---|---|---|---|---|---|---|
| | 1 | 2 | 3 | 4 | 5 | 6 | 7 | 8 |
| Deposition temperature | 150° C. | 250 | 300 | 350 | 400 | 450 | 500 | 600 |
| Deposition time (min.) | 4.5 | 4.2 | 4.1 | 3.9 | 3.6 | 3.4 | 3.0 | 2.7 |
| Refractive index | 2.00 | 2.03 | 2.08 | 2.12 | 2.15 | 2.16 | 2.20 | 2.25 |
| Thickness | 830Å | 810 | 800 | 780 | 770 | 750 | 740 | 720 |

Sample No. 1 is for comparison with the present invention, in which the coating deposition temperature lies between 250° C. and 600° C.

Figure 10:
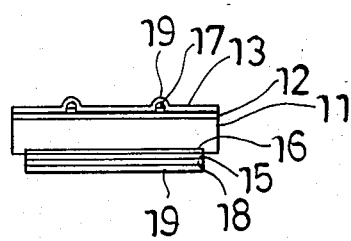
FIG. 10 shows a cross-sectional view of a solar cell manufactured by a conventional method.

The electrical characteristics of these samples are listed in Table 2, together with those of a conventional solar cell (denoted by "Sample No. 9") having the structure shown in FIG. 10, in which reference number 11 indicates a p-type silicon wafer, 12 an n+ layer, 13 an antireflection coating provided after the formation of electrodes, 15 an electrode made from Al paste, 16 a p+ layer, 17 upper-side electrodes, 18 a lower-side electrode, and 19 a solder overcoat. All of the characteristics shown in Table 2 are based on measurements carried out at a temperature of 25° C. by using a solar simulator (an artificial source of sunlight) of AM 1.

As is shown in Table 2, the present invention has improved, in comparison with both the sample No. 1 for comparison and the conventional solar cell (No. 9), the short-circuit currents, open circuit output voltages, optimum currents and voltages at optimum loads, giving conversion efficiencies of 11.04% to 12.56%.

The improvement in the conversion efficiencies appears due to the fact that surface inactivation of the wafer decreases the surface recombination speeds of the minority carriers produced at the time of light incidence. Particularly in the case where the wafer is made of polycrystalline silicon, hydrogen dissociated from the silane ($SiH_4$) gas or ammonia ($NH_3$) gas used in the process of coating the silicon nitride film seems to largely compensate, at high process temperatures, the carriers lost at the polycrystalline grain boundaries in the wafer.

We claim:
1. A method of manufacturing a solar cell composed of a polycrystalline silicon wafer with a silicon nitride film deposited thereon as an antireflection coating, said cell having an improved energy conversion efficiency, said method comprising the steps of:
    depositing said silicon nitride film on said polycrystaline silicon wafer by a plasma CVD method, said polycrystaline silicon wafer being maintained at a temperature between 350° C. and 500° C.;
    removing by an etching method portions of said silicon nitride film deposited in said depositing step, the portions to be removed corresponding to the areas where an electrode is to be formed; and
    forming said electrode at said portions where said silicon nitride film is removed in said second process, whereby a solar cell having an energy conversion efficiency greater than 11.5% is produced.

* * * * *

TABLE 2

| | Sample No. | Deposition temperature (°C.) | Short-circuit current (mA/cm$^2$) | Open circuit voltage (V) | Optimum current (mA/cm$^2$) | Optimum voltage (V) | Conversion efficiency (%) | Fill Factor |
|---|---|---|---|---|---|---|---|---|
| Comparison | 1 | 150 | 26.0 | 0.555 | 23.8 | 0.440 | 10.47 | 0.726 |
| Present | 2 | 250 | 27.6 | 0.560 | 24.8 | 0.445 | 11.04 | 0.713 |
| Invention | 3 | 300 | 28.6 | 0.565 | 25.0 | 0.450 | 11.25 | 0.696 |
| | 4 | 350 | 29.6 | 0.570 | 26.4 | 0.452 | 11.93 | 0.707 |
| | 5 | 400 | 30.5 | 0.577 | 27.3 | 0.460 | 12.56 | 0.714 |
| | 6 | 450 | 29.8 | 0.573 | 26.8 | 0.455 | 12.19 | 0.714 |
| | 7 | 500 | 29.2 | 0.569 | 26.5 | 0.450 | 11.93 | 0.718 |
| | 8 | 600 | 27.8 | 0.560 | 25.3 | 0.440 | 11.13 | 0.715 |
| Conventional | 9 | 175 | 25.2 | 0.550 | 23.0 | 0.440 | 10.12 | 0.730 |